(12) United States Patent
Jennings

(10) Patent No.: US 6,200,388 B1
(45) Date of Patent: Mar. 13, 2001

(54) SUBSTRATE SUPPORT FOR A THERMAL PROCESSING CHAMBER

(75) Inventor: Dean C. Jennings, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/022,134

(22) Filed: Feb. 11, 1998

(51) Int. Cl.[7] .................................................. C23C 16/00
(52) U.S. Cl. ............................ 118/728; 118/500; 156/345
(58) Field of Search .................... 118/728, 500; 156/345

(56) References Cited

U.S. PATENT DOCUMENTS

| | | | |
|---|---|---|---|
| 698,031 | 4/1902 | Leslie | 52/390 |
| 1,850,684 | 3/1932 | Nathan | 476/72 |
| 3,622,427 | 11/1971 | Kelly | 161/42 |
| 4,770,630 | 9/1988 | Akimoto et al. | 432/121 |
| 5,038,713 | * 8/1991 | Kawakami et al. | 118/723 |
| 5,146,481 | * 9/1992 | Garg et al. | 378/35 |
| 5,316,472 | 5/1994 | Niino et al. | 432/241 |
| 5,431,561 | 7/1995 | Yamabe et al. | 432/253 |
| 5,453,404 | * 9/1995 | Leedy | 437/203 |
| 5,458,688 | 10/1995 | Watanabe | 118/724 |
| 5,482,559 | 1/1996 | Imai et al. | 118/728 |
| 5,556,275 | 9/1996 | Sakata et al. | 432/241 |
| 5,658,710 | * 8/1997 | Neukermans | 430/320 |
| 5,660,472 | * 8/1997 | Peuse et al. | 374/128 |
| 5,755,511 | * 5/1998 | Peuse et al. | 374/128 |
| 5,770,324 | * 6/1998 | Holmes et al. | 428/688 |
| 5,836,150 | * 11/1998 | Garcia | 60/256 |
| 5,848,842 | * 12/1998 | Peuse et al. | 374/1 |
| 5,863,170 | * 1/1999 | Boitnott et al. | 414/222 |

FOREIGN PATENT DOCUMENTS

| | | |
|---|---|---|
| 0 713 245 A2 | 5/1996 | (EP) . |
| 0 840 358 A2 | 5/1998 | (EP) . |
| 61-049416 | * 3/1986 | (JP) . |

* cited by examiner

Primary Examiner—Jeffrie R. Lund
(74) Attorney, Agent, or Firm—Fish & Richardson

(57) ABSTRACT

A semiconductor wafer support for use in a thermal processing chamber includes a shelf for receiving a semiconductor wafer. The wafer support is formed of a silicon carbide substrate having a polysilicon layer disposed on the substrate, and a silicon nitride layer disposed on the polysilicon layer. A method of forming the multi-layered semiconductor wafer support is also disclosed.

18 Claims, 4 Drawing Sheets

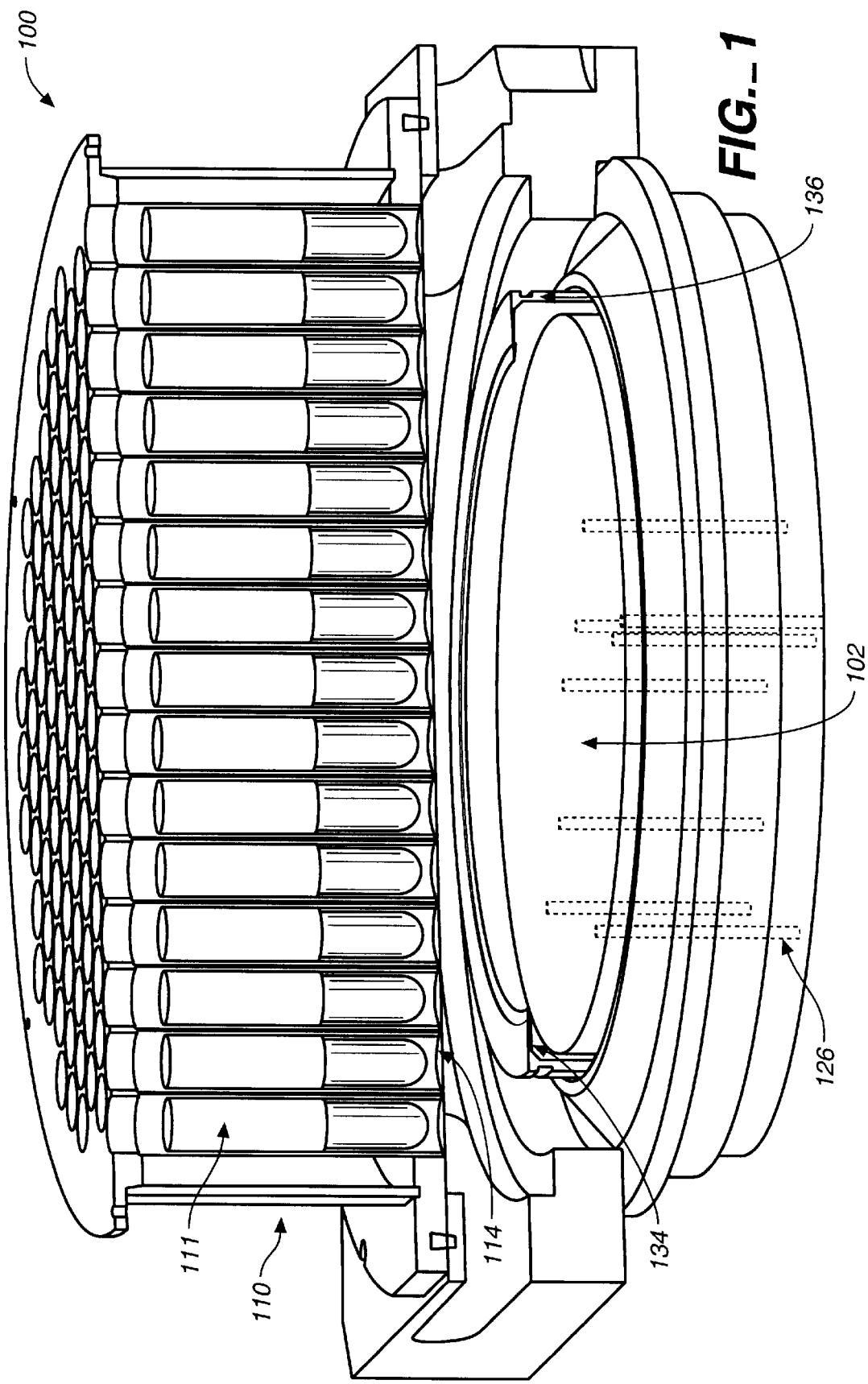

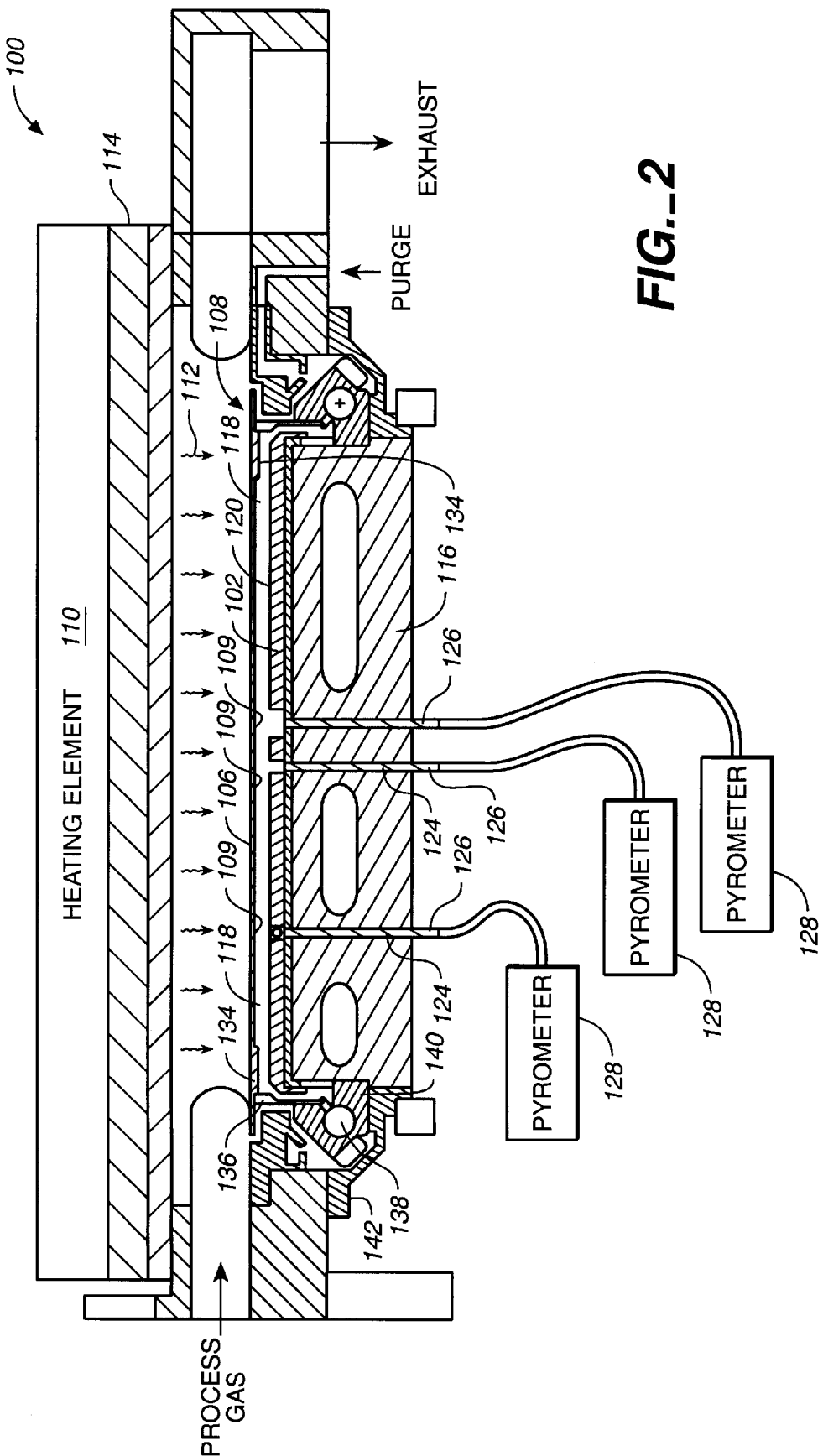
FIG._2

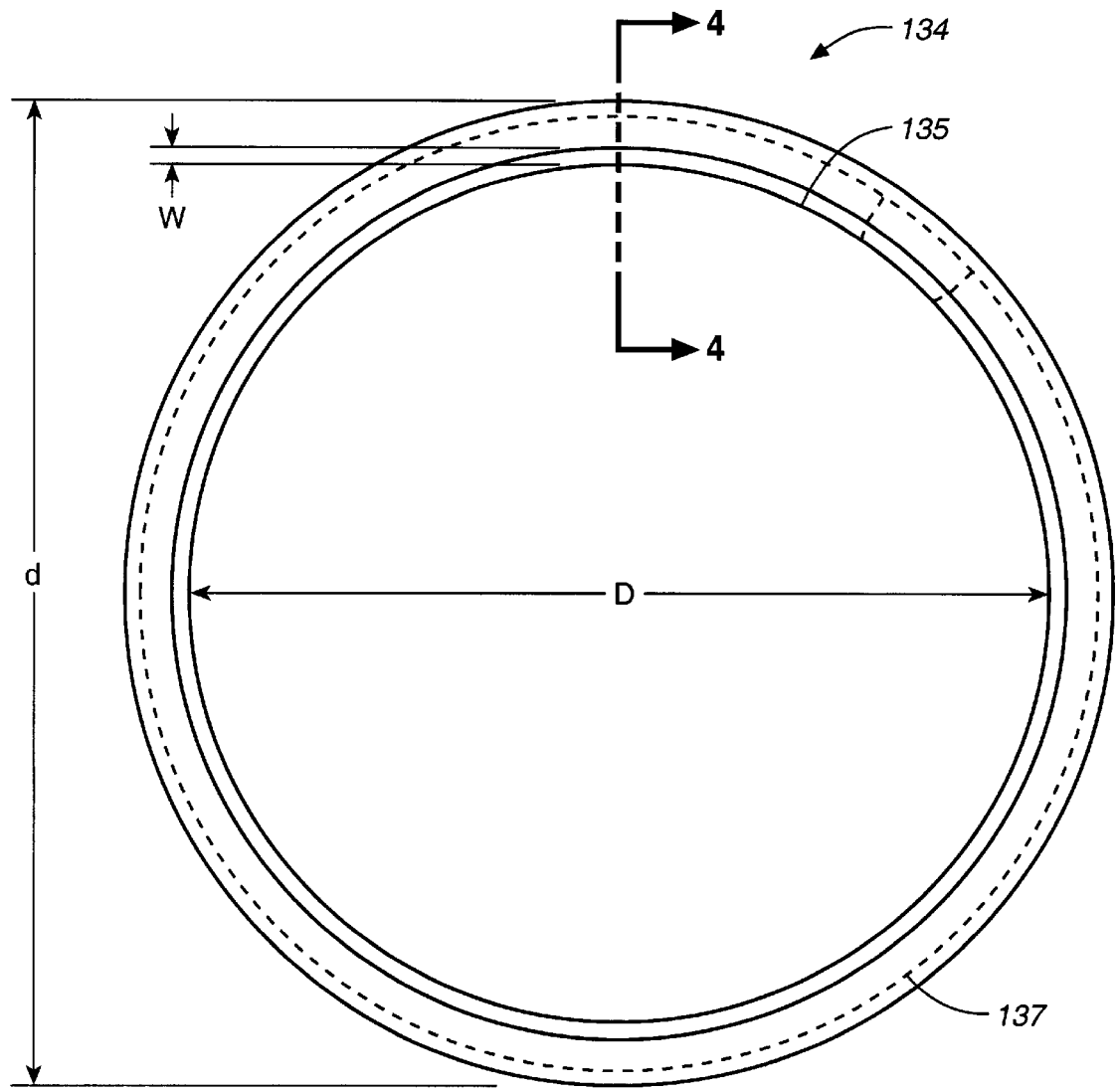
FIG._3

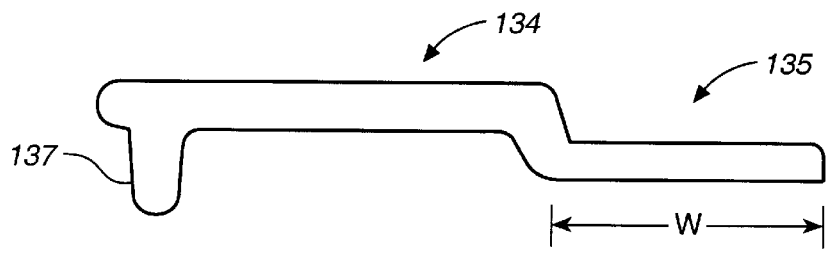
FIG._4
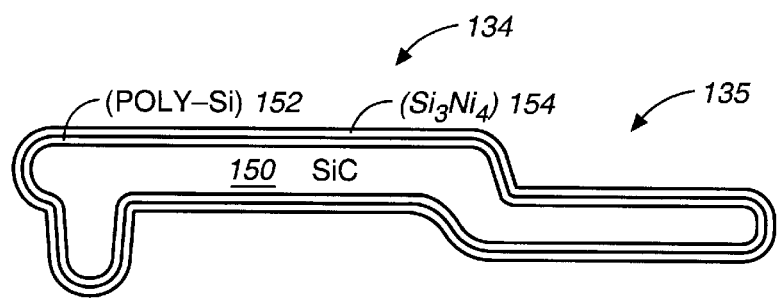
FIG._5
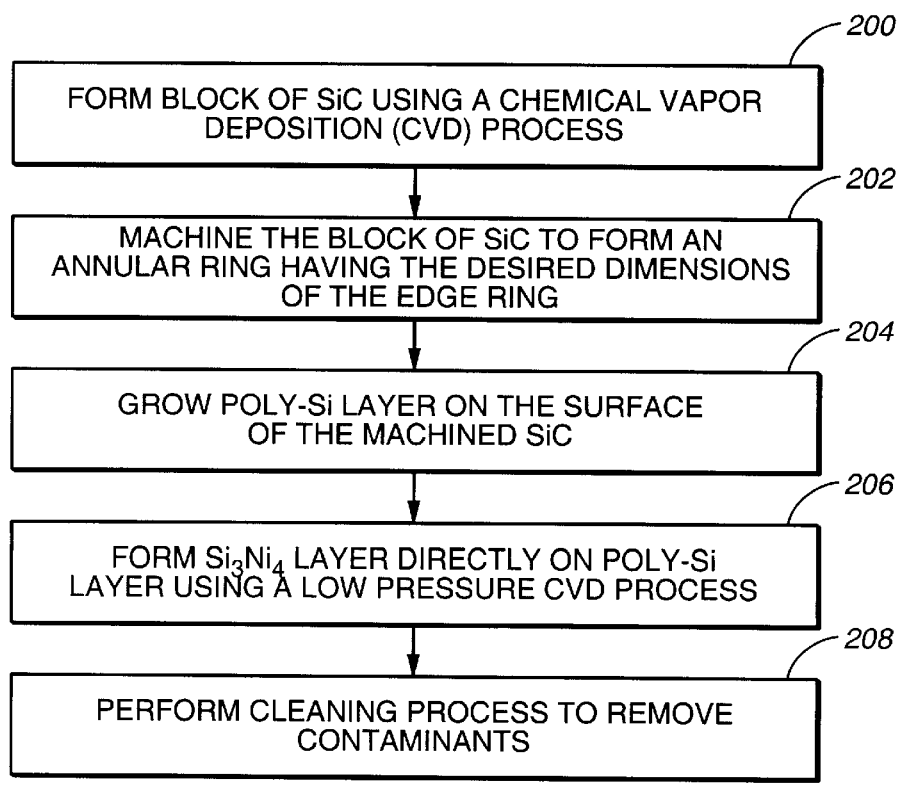
FIG._6

SUBSTRATE SUPPORT FOR A THERMAL PROCESSING CHAMBER

BACKGROUND

This invention relates to a substrate support for a thermal processing chamber.

In many semiconductor device manufacturing processes, the required high levels of device performance, yield, and process repeatability can only be achieved if the temperature of the substrate (e.g., a semiconductor wafer) is tightly monitored and controlled during processing of the substrate.

Rapid thermal processing (RTP), for example, is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN). The temperature in an RTP chamber, however, may exceed 1100° C. and is subject to rapid change, thereby making precise control of the substrate temperature more complicated and more difficult.

Additionally, although it is desirable to provide a substantially uniform temperature throughout the substrate during many manufacturing processes, the support on which the substrate rests can affect the manufacturing system's ability to achieve such uniformity. In susceptorless systems, for example, the substrate is usually only supported around its perimeter with an edge ring. In some situations, however, the edge ring acts as a thermal load which removes heat from the edge of the substrate, thereby making it difficult to provide a uniform temperature across the substrate and interfering with temperature measurements.

SUMMARY

In general, in one aspect of the invention, a semiconductor wafer support includes a shelf for receiving a semiconductor wafer. The support is formed of a silicon carbide substrate, a polysilicon layer disposed on the silicon carbide substrate, and a silicon nitride layer disposed on the polysilicon layer. In one implementation, the wafer support is an edge ring that includes an annular support for receiving a semiconductor wafer.

In another aspect, a method of forming a semiconductor wafer support includes forming a silicon carbide substrate, providing a polysilicon layer on the substrate, and providing a silicon nitride layer on the polysilicon layer. The substrate can be annular-shaped.

Various implementations include one or more of the following features. The edge ring or other wafer support can be disposed in a thermal semiconductor processing chamber. The polysilicon layer, which can include intrinsic or doped polysilicon, can be disposed directly on the silicon carbide substrate. Similarly, the silicon nitride layer can be disposed directly on the polysilicon layer. The polysilicon and silicon nitride layers can cover substantially the entire surface of the silicon carbide substrate.

In one implementation, the silicon nitride layer has a thickness in the range of 1800–2000 angstroms, and the polysilicon layer has a thickness of approximately 100 microns. Other thicknesses, however, can be used for either or both of the layers. Thus, the silicon nitride layer can have thicknesses of less than or more than 2000 angstroms. The silicon nitride layer can form an anti-reflective coating.

Although the wafer support or edge ring can be made using many different techniques, according to one technique, the polysilicon layer is grown in an epitaxial reactor, and the silicon nitride layer is grown using a low pressure chemical vapor deposition process.

Various implementations include one or more of the following advantages. The addition of the silicon nitride layer can improve the emissivity of the edge ring or other substrate support. In some systems, an RTP temperature controller measures the chamber temperature and determines the power required to affect a temperature change. The higher emissivity of the edge ring allows it to absorb or emit the radiation from a heating element more quickly. The edge ring can, therefore, respond more quickly to temperature changes.

The silicon nitride layer also can prevent formation of an oxide layer during processing, thereby resulting in a more uniform temperature across the semiconductor substrate and more accurate temperature measurements. In addition, the silicon nitride layer can help reduce the occurrence of a failures to a heating element in the chamber. Furthermore, the silicon nitride layer can act as a diffusion barrier to prevent impurities that may be present in the poly-Si layer from contaminating a semiconductor substrate supported by the edge ring.

Use of the silicon nitride layer allows the edge ring to behave like an extension of the substrate so that the temperatures and temperature changes of the edge ring and substrate coincide more closely with one another. As a result, the energy entering the chamber in which the edge ring is disposed can be more balanced throughout different parts of the chamber, and groups of lamps in the heating element can be more easily controlled by the RTP temperature controller.

Additional features and advantages will be readily apparent from the following detailed description, drawings and claims.

BRIEF DESCRIPTION OF THE DRAWINGS

FIG. 1 is an elevated partial cross-sectional view of an RTP system according to the present invention.

FIG. 2 is a cross-sectional side view of the RTP system according to the present invention.

FIG. 3 is a plan view of an edge ring according to the present invention.

FIG. 4 is a cross-sectional side view of the edge ring of FIG. 3 along line 3—3.

FIG. 5 is a cross-sectional side view of the edge ring of FIG. 3 illustrating further details according to one implementation of the present invention.

FIG. 6 is a flow chart for making an edge ring according to one implementation of the present invention.

DETAILED DESCRIPTION

FIGS. 1 and 2 illustrate a rapid thermal processing (RTP) system including a processing chamber 100 for processing a disk-shaped silicon substrate 106. Various features of the RTP system are described in further detail in U.S. patent application Ser. No. 08/641,477, entitled "Method and Apparatus for Measuring Substrate Temperatures", filed on May 1, 1996 now U.S. Pat. No. 5,755,511, which is incorporated herein by reference.

The substrate 106 is mounted inside the chamber on a substrate support structure 108 and is heated by a heating element 110 located directly above the substrate. The heating element 110, which can include tungsten (W) halogen lamps 111, generates radiation 112 which enters the processing chamber 100 through a water-cooled quartz window assembly 114 disposed above the substrate. The lamps 111 can be arranged in multiple zones which are grouped together in several control groups. A temperature control algorithm is used to control the lamps and, thereby to control the temperature. Beneath substrate 106 is a reflector 102 which is mounted on a water-cooled, stainless steel base 116. The reflector 102 can be made of aluminum and has a highly reflective surface coating. The underside of substrate 106 and the top of reflector 102 form a reflecting cavity 118 for enhancing the effective emissivity of the substrate, thereby improving the accuracy of temperature measurement.

The temperatures at localized regions 109 of the substrate 106 are measured by a plurality of temperature probes 126 and pyrometers 128. The temperature probes 126, which can include fiber-optic probes, are distributed at varying distances from the center of the substrate 106.

During thermal processing, the support structure 108 is rotated. In one implementation, for example, the support structure is rotated at about 90 revolutions per minute. Thus, each probe samples the temperature profile of a corresponding annular ring area on the substrate. The support structure which rotates the substrate includes an edge ring 134 which contacts the substrate around the substrate's outer perimeter, thereby leaving all of the underside of the substrate exposed except for a small annular region about the outer perimeter.

The edge ring 134 rests on a rotatable tubular quartz cylinder 136 that is coated with silicon to render it opaque in the frequency range of pyrometers 128. The silicon coating on the quartz cylinder acts as a baffle to block out radiation from external sources that might disturb the temperature measurements. The bottom of the quartz cylinder is held by an annular upper bearing race 142 which rests on a plurality of ball bearings 138 that are, in turn, held within a stationary, annular, lower bearing race 140.

Referring to FIGS. 3 and 4, edge ring 134 includes an annular shelf or lip 135 upon which the edge of substrate 106 rests. For an 8-inch (200 mm) semiconductor wafer, the edge ring 134 can have a outer diameter (d) of approximately 9.3 inches, and an inner diameter (D) of approximately 7.6 inches (190 mm). The annular shelf or lip 135 can have a radial width (w) of approximately 0.2 inches (5 mm). The edge ring 134 can also include an annular rib 137. The rib 137 provides structural support for the edge ring 134. The foregoing dimensions are suitable for use of the edge ring 134 in certain processing chambers, such as the RTP Centura™ or the RTP Centura XE™, manufactured by Applied Materials, Inc. Other dimensions may be suitable for wafers of different sizes, for example, a 12-inch (300 mm) semiconductor wafer, or different processing systems.

Referring to FIG. 5, the main body of the edge ring 134 is formed from a silicon carbide (SiC) substrate 150. However, SiC is transparent to radiation in the frequency range used for temperature measurements of the substrate, and as a result, can transmit stray radiation that may affect the accuracy of the temperature measurement. Therefore, the edge ring 134 is coated with a layer of polysilicon (poly-Si) 152 to render it opaque to such radiation. In one implementation, a layer of intrinsic or doped poly-Si having a thickness of approximately 100 microns ($\mu$m) is formed directly over the entire top, bottom and side surfaces of the SiC substrate 150.

Providing a doped poly-Si layer on the SiC substrate can improve the low temperature absorption or emissivity of the edge ring 134 in the infrared range. That feature is advantageous because the temperature probes 126 and pyrometers 128 begin to detect temperatures of approximately 325° C. as the temperature of the wafer in the chamber 100 is raised. In some implementations, lower temperatures, for example, temperatures in the range of approximately 200–300° C., are detected. By increasing the emissivity of the edge ring 134 in the infrared range, the edge ring 134 can be heated more quickly so that the edge ring does not act as a thermal load taking away heat at the edges of the semiconductor wafer 106.

The edge ring 134 further includes a layer of silicon nitride ($Si_3Ni_4$) 154 disposed directly on the poly-Si layer 152. In one implementation, a $Si_3Ni_4$ layer 154 of approximately 1800–2000 angstroms (Å) is formed over the entire surface of the poly-Si layer 152. In another implementation, a $Si_3Ni_4$ layer 154 as thin as approximately 1200 angstroms (Å) is formed over the poly-Si layer 152. $Si_3Ni_4$ layers having thicknesses less than 1200 angstroms or greater than 2000 angstroms also can be used.

In general, the $Si_3Ni_4$ layer 154 can improve the emissivity of the edge ring 134. The higher emissivity of the edge ring 134 makes it more responsive to the RTP temperature controller.

It has been observed, for example, that when an edge ring formed of SiC with an outer layer of poly-Si is heated during the manufacturing of a semiconductor substrate, an oxide layer can form on the poly-Si layer. The oxide layer typically grows at a different rate at the inner periphery of the edge ring 134 than at the outer periphery. The build-up of the oxide layer causes the portions of the edge ring 134 near the inner periphery to heat up more quickly than portions of the edge ring near the outer periphery. Moreover, formation of an oxide layer on the underside of the edge ring 134, particularly in the vicinity of the annular shelf or lip 135, can effect measurements obtained through the temperature probes 126 as radiation is emitted or reflected from the underside of the edge ring 134.

The addition of the $Si_3Ni_4$ layer 154 can slow down or prevent formation of the oxide layer, thereby resulting in a more uniform temperature across the semiconductor substrate and more accurate temperature measurements.

In addition, use of the $Si_3Ni_4$ layer 154 can reduce the power consumption of some of the lamp zones in the heating element 110. Even if the total weighted energy is higher when the edge ring 134 is used, the power consumption of the zones of the heating element 110 can be controlled so that the energy entering the chamber 100 is more balanced. Also, in some implementations, the lamps 111 can use a lower average power than previously required because the edge ring 134 absorbs radiation from the lamps more efficiently. As such, the $Si_3Ni_4$ layer also can help reduce the occurrence of lamp failures.

The $Si_3Ni_4$ layer 154 also can act as a diffusion barrier to prevent metal impurities that may be present in the poly-Si layer 152 from contaminating the substrate 106.

As described above, the poly-Si and $Si_3Ni_4$ layers 152, 154 can be formed to cover substantially the entire surface of the edge ring 134. In other implementations, however, the poly-Si and $Si_3Ni_4$ layers 152, 154 need not cover the entire surface of the edge ring 134. Thus, the poly-Si and $Si_3Ni_4$ layers 152, 154 can be formed on the top surface only or the bottom surface only by using appropriate masks. For example, if the chamber 100 does not include the reflector 102 to reflect radiation back to the bottom surface of the edge ring, the layers 152, 154 can be formed on the top surface of the edge ring only.

FIG. 6 illustrates one implementation for manufacturing the edge ring 134. As indicated by step 200, a block of SiC is formed, for example, using a chemical vapor deposition (CVD) process. Next, as indicated by step 202, the block of SiC is machined to form an annular ring having the desired dimensions of the edge ring 134. A diamond grinding head, for example, can be used to machine the SiC block to the desired dimensions. A poly-Si layer is grown on the surface of the machined SiC, as indicated by step 204. In one implementation, the poly-Si coating is grown in an epitaxial reactor at a temperature of approximately 1150–1200° C. at atmospheric pressure. Alternatively, the poly-Si layer can be formed by a deposition process using two masks, one for each of the top and bottom surfaces of the edge ring 134. After formation of the poly-Si layer, an $Si_3Ni_4$ layer is formed, as indicated by step 206. In one implementation, a low pressure CVD process is used to grow the $Si_3Ni_4$ layer. In general, the edge ring 134 should be kept free of contamination and contact with metal as well as bare hands and other media which may transfer oils, metals or salts. As indicated by step 208, a cleaning process can be performed immediately following manufacture of the edge ring as well as just prior to insertion of the edge ring in the chamber 100.

Although the specific semiconductor substrate support described above is an edge ring 134, a SiC substrate with a layer of poly-Si disposed on the SiC and a layer of $Si_3Ni_4$ disposed directly on the poly-Si layer can be used as the semiconductor wafer support in a susceptor system as well. In such systems, the semiconductor wafer is placed on the susceptor support so that the amount of support is proportional to the surface area of the wafer.

Additionally, in many implementations, the edge ring 134 can have different dimensions from the specific dimensions described above. Similarly, the precise shape of the edge ring 134 may differ from that shown in FIGS. 3–5. For example, the annular shelf or lip 135 can have a sloped or beveled surface.

Other implementations are within the scope of the following claims.

What is claimed is:

1. A semiconductor wafer support comprising:
a body portion to receive a semiconductor wafer, the body portion being formed of a silicon carbide substrate, a polysilicon layer disposed on the silicon carbide substrate, and a silicon nitride layer disposed on the polysilicon layer.

2. The semiconductor wafer support of claim 1 wherein the support is disposed in a thermal processing chamber.

3. The semiconductor wafer support of claim 1 wherein the support is disposed in a semiconductor processing chamber.

4. The semiconductor wafer support of claim 1 wherein the polysilicon layer is disposed directly on the silicon carbide substrate.

5. The semiconductor wafer support of claim 1 wherein the silicon nitride layer is disposed directly on the polysilicon layer.

6. An edge ring comprising:
a body portion including an annular support to receive a semiconductor wafer, the body portion being formed of a silicon carbide substrate having a polysilicon layer disposed on the substrate, and a silicon nitride layer disposed on the polysilicon layer.

7. The edge ring of claim 6 wherein the edge ring is disposed in a thermal processing chamber.

8. The edge ring of claim 6 wherein the edge ring is disposed in a semiconductor processing chamber.

9. The edge ring of claim 6 wherein the polysilicon layer is disposed directly on the silicon carbide substrate.

10. The edge ring of claim 6 wherein the polysilicon layer comprises doped polysilicon.

11. The edge ring of claim 6 wherein the silicon nitride layer is disposed directly on the polysilicon layer.

12. The edge ring of claim 6 wherein the silicon nitride layer is disposed directly on the polysilicon layer.

13. The edge ring of claim 6 wherein the polysilicon and silicon nitride layers cover substantially the entire surface of the silicon carbide substrate.

14. The edge ring of claim 6 wherein the silicon nitride layer has a thickness of less than 2000 angstroms.

15. The edge ring of claim 6 wherein the silicon nitride layer has a thickness in the range of 1800–2000 angstroms.

16. The edge ring of claim 6 wherein the polysilicon layer has a thickness of approximately 100 microns.

17. The edge ring of claim 6 dimensioned to support a semiconductor wafer.

18. The edge ring of claim 6 wherein the polysilicon and silicon nitride layers form an anti-reflective coating.

* * * * *